United States Patent
Damghanian et al.

(10) Patent No.: US 11,929,377 B2
(45) Date of Patent: Mar. 12, 2024

(54) IMAGE SENSOR COMPRISING AN ARRAY OF PIXELS FOR REDUCING THE SHADOWING EFFECT, AND CORRESPONDING DESIGNING METHOD AND COMPUTER PROGRAM PRODUCT

(71) Applicant: InterDigital CE Patent Holdings, Paris (FR)

(72) Inventors: Mitra Damghanian, Cesson-Sevigne (FR); Oksana Shramkova, Cesson-Sevigne (FR); Valter Drazic, Betton (FR)

(73) Assignee: InterDigital CE Patent Holdings, SAS, Paris (FR)

( * ) Notice: Subject to any disclaimer, the term of this patent is extended or adjusted under 35 U.S.C. 154(b) by 813 days.

(21) Appl. No.: 16/958,459

(22) PCT Filed: Dec. 20, 2018

(86) PCT No.: PCT/EP2018/086335
§ 371 (c)(1),
(2) Date: Jun. 26, 2020

(87) PCT Pub. No.: WO2019/129659
PCT Pub. Date: Jul. 4, 2019

(65) Prior Publication Data
US 2021/0066371 A1 Mar. 4, 2021

(30) Foreign Application Priority Data
Dec. 27, 2017 (EP) .................................... 17306935

(51) Int. Cl.
*H01L 27/146* (2006.01)
(52) U.S. Cl.
CPC .. *H01L 27/14621* (2013.01); *H01L 27/14605* (2013.01); *H01L 27/14625* (2013.01)

(58) Field of Classification Search
CPC ....... H01L 27/14603–14616; H01L 27/14621; H01L 27/14625
See application file for complete search history.

(56) References Cited

U.S. PATENT DOCUMENTS 7,557,419 B2  7/2009  Gazeley
7,659,929 B2  2/2010  Sakoh
(Continued)

FOREIGN PATENT DOCUMENTS

CN  101233762  7/2008
CN  101449575  6/2009
(Continued)

OTHER PUBLICATIONS

International Preliminary Report on Patentability for PCT/EP2018/086335 dated Jun. 30, 2020, 6 pages.
(Continued)

*Primary Examiner* — Tucker J Wright
(74) *Attorney, Agent, or Firm* — Jeffery J. Brosemer

(57) ABSTRACT

The present disclosure relates to an image sensor (21) comprising an array of pixels, wherein a set of pixels of the array comprises pixels with different height levels arranged according to their height level and relative position to an optical axis (22) of the image sensor, wherein each pixel of the set can take one height level i among N different height levels, N≥2, where i=1 is the smallest height level and i=N is the highest height level. According to the disclosure, for a pixel of the set having a first height level equal to n, 2≥n≥N, and an adjacent pixel of the set having a second height level equal to m, lower than the first height level, in at least one of horizontal, vertical, or diagonal scanning direction, from a point at which the optical axis (22) intersects the image sensor (21) to at least one rim of the image sensor, the second height level m is equal to n−1.

4 Claims, 3 Drawing Sheets

(56) References Cited

U.S. PATENT DOCUMENTS

Figure 1A:
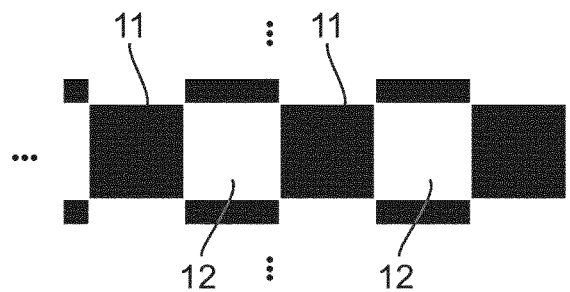

| | | |
|---|---|---|
| 8,139,130 B2 | 3/2012 | Compton |
| 8,325,262 B2 | 12/2012 | Choi |
| 8,391,637 B2 | 3/2013 | Kinoshita |
| 8,988,582 B2 | 3/2015 | Findlay |
| 9,609,228 B2 | 3/2017 | Kuboi |
| 9,883,128 B2 | 1/2018 | Banachowicz |
| 10,620,049 B2 | 4/2020 | Tack |
| 2007/0268533 A1 | 11/2007 | Kijima |
| 2010/0059802 A1 | 3/2010 | Chen |
| 2014/0267848 A1 | 9/2014 | Wu |
| 2014/0285627 A1 | 9/2014 | Kuboi |
| 2015/0181189 A1 | 6/2015 | Richard |
| 2016/0364612 A1 | 12/2016 | Dixon |
| 2021/0066371 A1 | 3/2021 | Damghanian et al. |

FOREIGN PATENT DOCUMENTS

| | | |
|---|---|---|
| CN | 101685534 | 3/2010 |
| CN | 102710902 | 10/2012 |
| CN | 102741671 | 10/2012 |
| CN | 104065894 | 9/2014 |
| CN | 104735433 | 6/2015 |
| CN | 206727071 | 12/2017 |
| EP | 3460848 A1 | 3/2019 |
| JP | 2003289547 A | 10/2003 |

OTHER PUBLICATIONS

International Search Report and Written Opinion of the International Searching Authority for PCT/EP2018/086335 dated Jan. 25, 2019, 12 pages.

Blockstein, et al., "Crosstalk quantification, analysis, and trends in CMOS image sensors", Applied Optics vol. 49, Issue 24, pp. 4483-4488 (2010).

Tournier et al., "Pixel-to-Pixel isolation by Deep Trench technology: Application to CMOS Image Sensor", Jun. 2011, Conference: HISW 2011At: Hokkaido, Japan, 4 pages.

Fesenmaier, et al., "Optical confinement methods for continued scaling of CMOS image sensor pixels", Optics Express vol. 16, Issue 25, pp. 20457-20470 (2008).

"Color Filter Array Designs", 24 pages. Available at: http://www.quadibloc.com/other/cfaint.htm.

Lee, et al. "Efficiency enhancement in a backside illuminated 1.12 μm pixel CMOS image sensor via parabolic color filters," Opt. Express 24, 16027-16036 (2016) (10 pages).

| Illumination direction | Solution for minimized shadowing |
|---|---|
| → | HML |
| ← | LMH |
| → | LHM |
| ← | HLM |

| Illumination direction | Solution for minimized shadowing ||
| | One solution for both illumination directions | Solution optimized for each illumination direction |
|---|---|---|
| → | LMHHML or HMLLMH (identical in the array form) | HMLHML |
| ← | | LMHLMH |
| → | | LHMLHM |
| ← | | MHLMHL |

IMAGE SENSOR COMPRISING AN ARRAY OF PIXELS FOR REDUCING THE SHADOWING EFFECT, AND CORRESPONDING DESIGNING METHOD AND COMPUTER PROGRAM PRODUCT

The present application is a national stage application under 35 U.S.C. 371 of International Application No. PCT/EP2018/086335, entitled "AN IMAGE SENSOR COMPRISING AN ARRAY OF PIXELS FOR REDUCING THE SHADOWING EFFECT, AND CORRESPONDING DESIGNING METHOD AND COMPUTER PROGRAM PRODUCT", filed on Dec. 20, 2018, which claims benefit from European Patent Application Serial No. 17306935.2, entitled "AN IMAGE SENSOR COMPRISING AN ARRAY OF PIXELS FOR REDUCING THE SHADOWING EFFECT, AND CORRESPONDING DESIGNING METHOD AND COMPUTER PROGRAM PRODUCT", filed Dec. 27, 2017.

1. TECHNICAL FIELD

The present disclosure pertains to the technical field of image sensors for acquiring image data.

More specifically, the present disclosure relates to an image sensor and a method for designing the arrangement of pixels in an image sensor for reducing the shadowing effect appearing when neighboring pixels of the image sensor have different height levels.

The present disclosure also pertains to a new mosaic pattern and corresponding demosaicking algorithm, when the different height levels of the pixels come from the color filters of the pixels.

2. BACKGROUND

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, these statements are to be read in this light, and not as admissions of prior art.

The design of an image sensor is a process in which one skilled in the art should overcome several technical problems. Usually, one skilled in art should cope with at least one of the crosstalk effect and the pixel size shrinkage limit, as well some constraints related to the manufacturing.

In particular, when designing an image sensor, the architecture of the pixels can be identical for all the pixels of the image sensor, or adjusted individually for each pixel for specific requirement or desired properties, related to the wavelength, material, etc. When pixels are adjusted individually, such adjustment can result in an image sensor comprising pixels with different height levels.

Figure 1B:
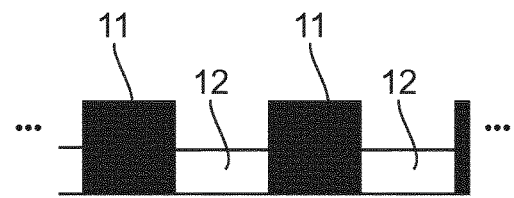

FIGS. 1A and 1B respectively illustrate a top view and side view of an exemplary image sensor with non-identical pixels in a 2D array, where pixels 11 have a finished architecture with a higher height than pixels 12.

One example of pixel arrays with different height of the finished surface is when different types of pixels are put together in an array for multiple measurements, like combining depth sensing pixels and RGB pixels to get the light intensity and depth information in one sensor. Another example is when the height of the optical stack is adjusted for pixels in each color channel to get the optimized color filtering effect, which is discussed in European patent application EP17306274.6 filed on 26 Sep. 2017, in the name of the Applicant. Another example is when the optical stack in different pixel groups is optimized to focus a particular sub-band of the incident light at a specific depth, resulting in different height of the optical stack.

In all these examples, the 2D array of pixels can be irregular or uneven, and shadowing can arise. Such shadowing undermines the performance of the image sensor by blocking the light before it reaches the intended pixel.

The shadowing can be reduced by avoiding large angles of the incident light. However, such constraint restrains the design of the image sensor and camera's optical system.

Hence, there is a need for a new image sensor that can address these issues.

3. SUMMARY OF THE DISCLOSURE

References in the specification to "one embodiment", "an embodiment", "an example embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present disclosure is directed to an image sensor comprising an array of pixels, wherein a set of pixels of the array comprises pixels with different height levels arranged according to their height level and relative position to an optical axis of the image sensor, and wherein each pixel of the set can take one height level i among N different height levels, $N \geq 2$, where $i=1$ is the smallest height level and $i=N$ is the highest height level.

According to the disclosure, for a pixel of the set having a first height level equal to n, $2 \leq n \leq N$, and an adjacent pixel of the set having a second height level equal to m, lower than the first height level, in at least one of horizontal, vertical, or diagonal scanning direction, from a point at which the optical axis intersects the image sensor to at least one rim of the image sensor, the second height level m is equal to n−1.

In this way, the maximum difference in height between neighboring pixels, form a first height level to a second lower height level in the scanning direction, is minimized. Consequently, the shadow produced by the pixel with the first height on the neighboring pixel with the second lower height is also minimized.

The present disclosure thus aims at reducing the shadowing effect when the pixels of the set have different height levels. In particular, it aims at reducing the shadowing effect in case, for example, of large angles of the incident light and/or large differences in the finished height of the neighboring pixels. In this way, it is possible to relax some constraints on the design of the image sensor and consequently camera's optical system (for example). In particular, it is possible to relax constraint in terms of the light incidence angle and varied finished height of the pixels in the camera's optical system and image sensor designs.

According to at least one embodiment, only the arrangement of pixels in the image sensor is changed compared to prior art. The architecture of the pixels, and thus the fabrication process, are the same than prior art, except that the lithography masks must be adapted to the new arrangement of pixels.

In particular, the set of pixels also respects at least one design criterion belonging to the group comprising:
- a proximity criterion, defining the distribution of the color filters in the pattern;
- a distribution ratio, defining the ratio of the different height levels in the pattern.

With regards to the proximity criterion, the distribution or interleave of the different colors shall ensure a good proximity of the missing color. For example, if we consider a N colors pattern consisting in colors A1, A2, ..., AN, then the pattern should be such that for any color Ai, at row r and column c, we shall find all Aj (j=1, ..., N and j≠i) at at least one position within the rows r−1, r, r+1 and columns c−1, c, c+1.

According to at least one embodiment, the set of pixels can comprise only the pixels located at the "border" of the image sensor, as pixel far from the optical axis are more prone to the shadowing effect.

According to another embodiment, the set of pixels comprises all the pixels of the array, as even the pixels located at the center of the image sensor can suffer from shadowing since they also receive light from a spread cone angle rather than only normal light incidence.

According to at least one embodiment, the pixels of the set comprise color filters and, for each pixel, the height level of the pixel depends on the color selectivity of the color filter.

In other words, such a pixel transmits substantially only one color among, for example, red, green and blue colors, and has a height or thickness which is defined according to at least the color it transmits.

According to at least one embodiment, the pixels of the set are arranged to comply with a periodic height pattern in the scanning direction.

For example, such height pattern comprises at least one base pattern comprising pixels in decreasing height order in the scanning direction.

For example, if we consider three height levels, namely a high height level (H), a medium height level (M), and a low height level (L), such base pattern can be HML. The size of the base pattern in this case is equal to N, i.e. to the number of height levels.

The height pattern can be formed of any cyclic permutation (for example: HML or MLH or LHM) and repetition of the base pattern.

In particular, the size of the height pattern in the scanning direction is a multiple of the number of different height levels of the pixels of the set in the scanning direction.

For example, the size of the height pattern can be 2, 4, etc, if we consider 2 height levels in the scanning direction. The size of the height pattern can be 3, 6, etc, if we consider 3 height levels in the scanning direction.

According to at least one embodiment, the height pattern comprises 50% of pixels with a green color filter, 25% of pixels with a blue color filter, and 25% of pixels with a red color filter, and the pixels with different color filters are interleaved in the height pattern.

For example, the height pattern comprises 8×8 pixels arranged as follows:

| RGBGGBGR | BGRGGRGB |
| GBGRRGBG | GRGBBGRG |

-continued

| BGRGGRGB | RGBGGBGR |
| GRGBBGRG | GBGRRGBG |
| GRGBBGRG | GBGRRGBG |
| BGRGGRGB | RGBGGBGR |
| GBGRRGBG or | GRGBBGRG |
| RGBGGBGR | BGRGGRGB | where R stands for a pixel with a red color filter, B stands for a pixel with a blue color filter and G stands for a pixel with a green color filter.

According to at least one embodiment, the height pattern comprises 50% of pixels with a yellow color filter, 25% of pixels with a cyan color filter, and 25% of pixels with a magenta color filter, and the pixels with different color filters are interleaved in the height pattern.

For example, the height pattern comprises 8×8 pixels arranged as follows:

| CYMYYMYC | MYCYYCYM |
| YMYCCYMY | YCYMMYCY |
| MYCYYCYM | CYMYYMYC |
| YCYMMYCY or | YMYCCYMY |
| YCYMMYCY | YMYCCYMY |
| MYCYYCYM | CYMYYMYC |
| YMYCCYMY | YCYMMYCY |
| CYMYYMYC | MYCYYCYM | where M stands for a pixel with a magenta color filter, C stands for a pixel with a cyan color filter and Y stands for a pixel with a yellow color filter.

According to at least one embodiment, the structure of the image sensor is symmetrical with respect to the point at which the optical axis intersects the image sensor. In particular, the structure of the sensor is symmetrical with respect to a Cartesian axis passing through the center of the image sensor.

As the pixels are arranged relative to the optical axis of the image sensor, the performance of the image sensor is thus symmetrical.

The present disclosure also pertains to a method for designing an arrangement of pixels in an image sensor, comprising:
- obtaining a set of pixels with different height levels, wherein each pixel of the set can take one height level i among N different height levels, N≥2, where i=1 is the smallest height level and i=N is the highest height level,
- arranging the pixels of the set in an array of the image sensor, according to their height and relative position to an optical axis of the image sensor, wherein, for a pixel of the set having a first height level equal to n, 2≤n≤N, and an adjacent pixel of the set having a second height level, lower than the first height level, in at least one of horizontal, vertical, or diagonal scanning direction, from a point at which the optical axis intersects the image sensor to at least one rim of the image sensor, the second height level is equal to m=n−1.

Such method can be implemented in order to design an image sensor as previously described. It could of course comprise the different characteristics pertaining to the image sensor according to an embodiment of the disclosure, which can be combined or taken separately. Thus, the characteristics and advantages of the method are the same as those of the image sensor and are not described in more ample detail.

In particular, such method also comprises obtaining at least one design criterion belonging to the group comprising:

a proximity criterion, a distribution ratio.

If several arrangements are possible, the method also comprises choosing an optimal arrangement taking account of at least one of said design criterion, or other performance criterion, like the reduction of the crosstalk effect.

The present disclosure also pertains to a computer program product downloadable from a communication network and/or recorded on a medium readable by computer and/or executable by a processor comprising software code adapted to perform the previously described method when it is executed by a processor.

Another aspect of the disclosure pertains to an imaging device comprising an image sensor according to any one of the embodiments described above. Such image device can be, for example, a camera.

Certain aspects commensurate in scope with the disclosed embodiments are set forth below. It should be understood that these aspects are presented merely to provide the reader with a brief summary of certain forms the disclosure might take and that these aspects are not intended to limit the scope of the disclosure. Indeed, the disclosure may encompass a variety of aspects that may not be set forth below.

4. BRIEF DESCRIPTION OF THE DRAWINGS

Figure 2:
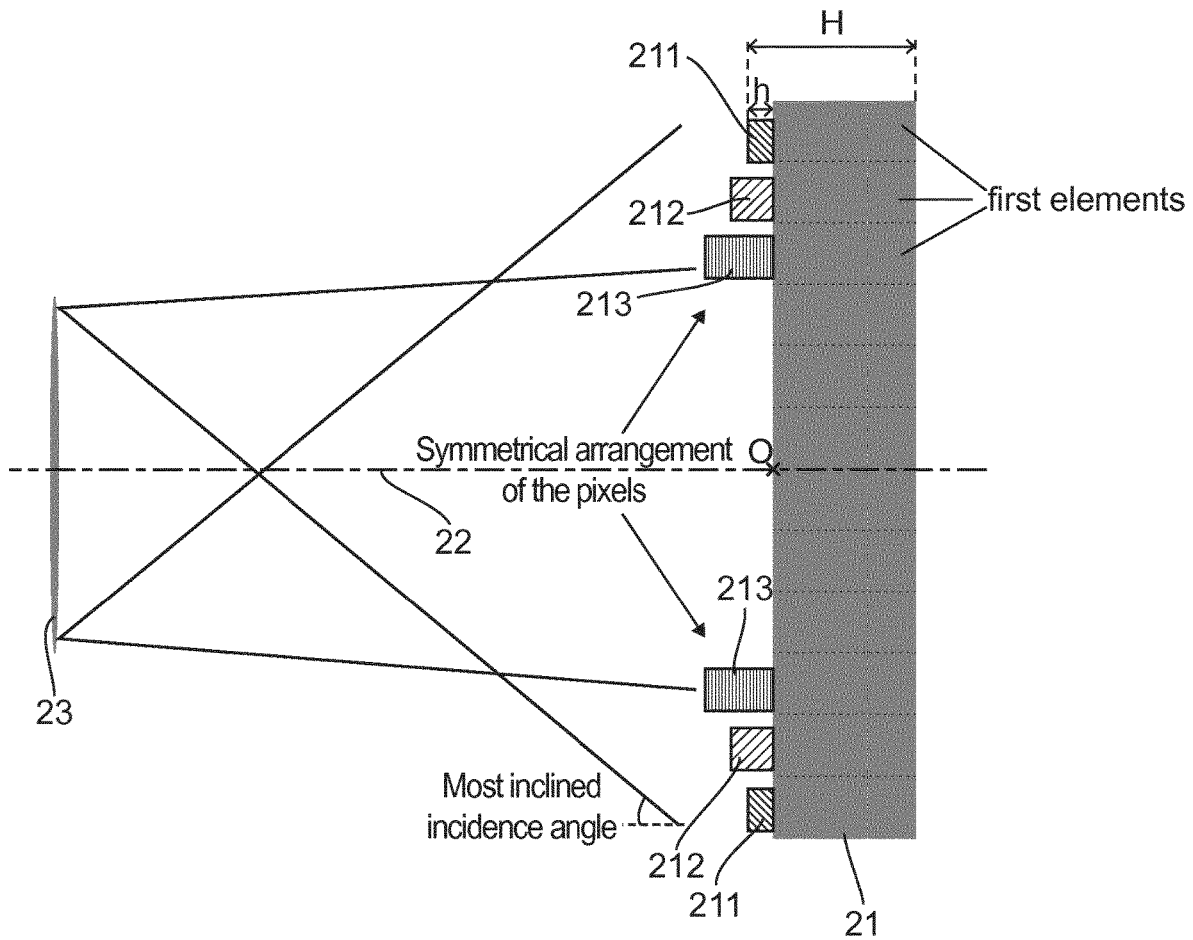
Figures 3, 4, 5:
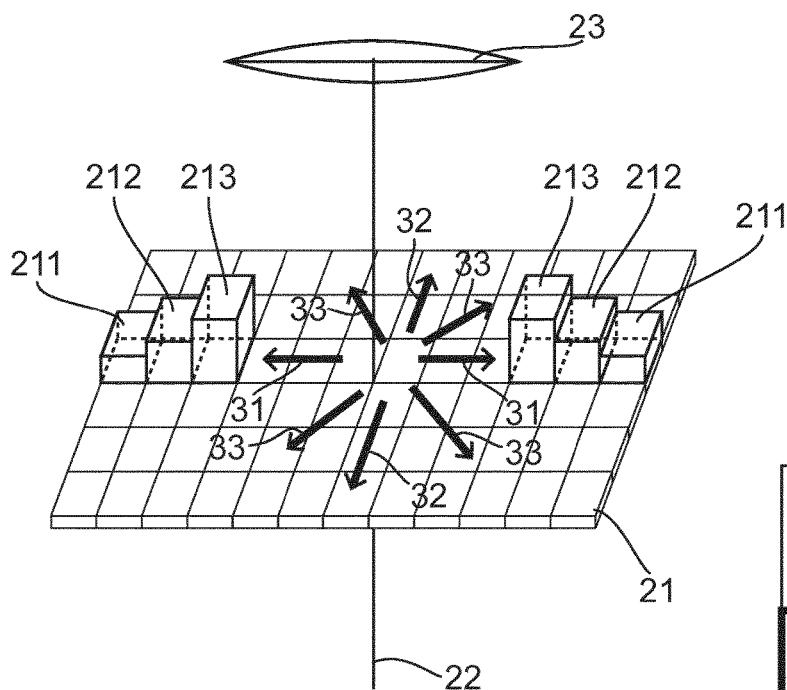
Figure 6:
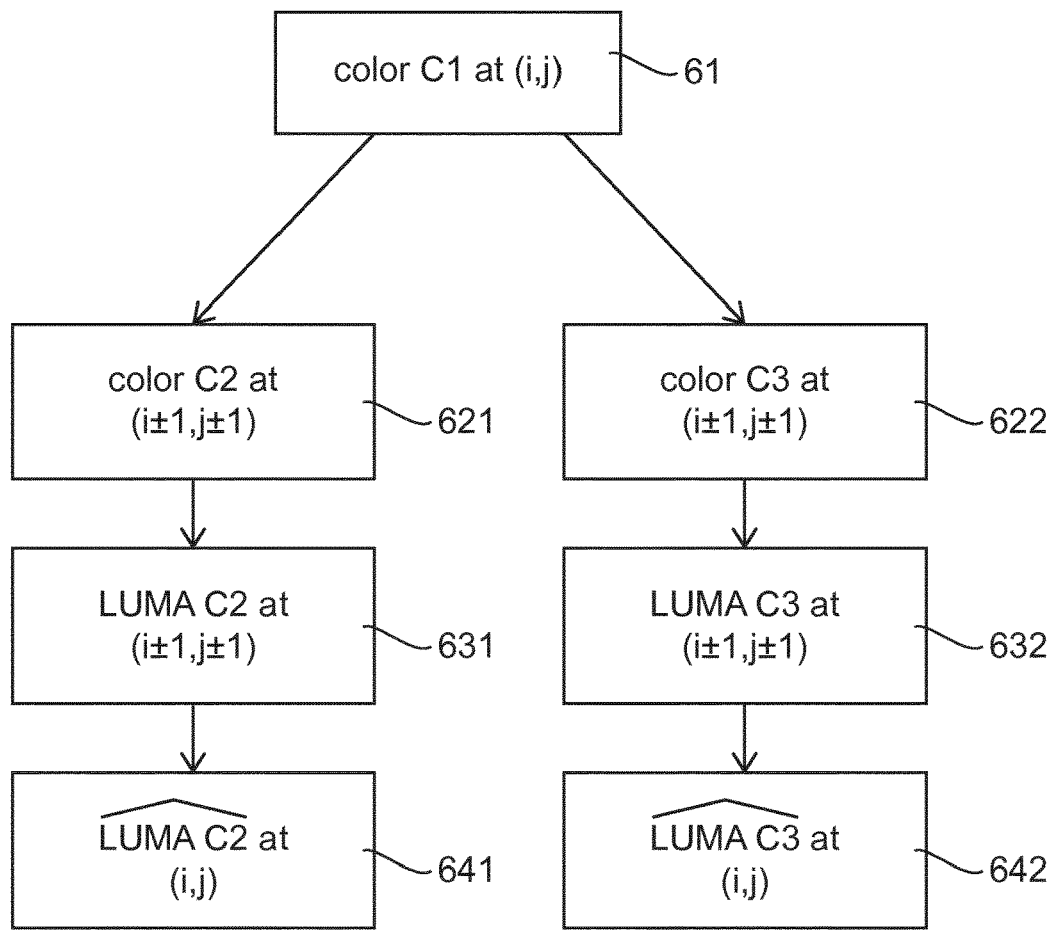
Figure 7:
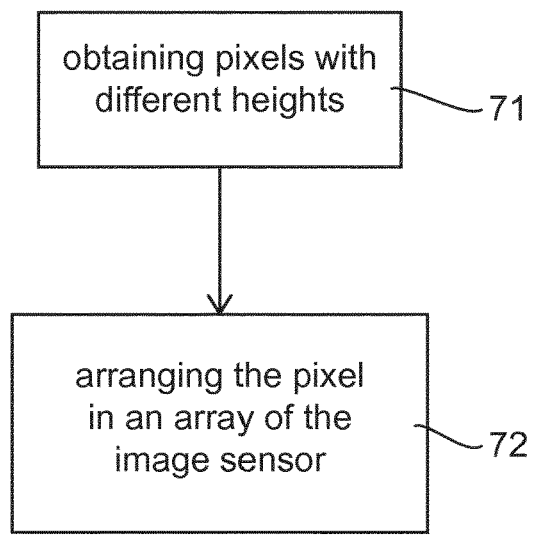

The above and other aspects of the invention will become more apparent by the following detailed description of exemplary embodiments thereof with reference to the attached drawings in which:

FIGS. 1A and 1B respectively illustrate, in a schematic way, a top view and side view of an image sensor comprising pixels with different heights;

FIG. 2 presents, in a schematic way, an example of an image sensor with pixels arranged according to an embodiment of the disclosure;

FIG. 3 presents, in a schematic way, a side view of the image sensor of FIG. 2;

FIGS. 4 and 5 give examples of decision table illustrating how to arrange the colors within an array to minimize shadowing effects according to at least on embodiment of the disclosure;

FIG. 6 illustrates the main steps of a demosaicking method according to at least one embodiment of the disclosure; and FIG. 7 illustrates the main steps of a method for designing an arrangement of pixels according to at least one embodiment of the disclosure.

5. DETAILED DESCRIPTION

It is to be understood that the figures and descriptions of the present disclosure have been simplified to illustrate elements that are relevant for a clear understanding of the present disclosure, while eliminating, for purposes of clarity, many other elements found in typical image sensors.

5.1 General Principle

The present disclosure proposes a new arrangement for the pixels in an image sensor, aiming at minimizing the shadowing effect of the neighboring pixels on each other. To do so, the present disclosure proposes an image sensor comprising an array of pixels, wherein a set of pixels of the array comprises pixels with different height levels arranged according to their height level and relative position to an optical axis of the image sensor, and wherein each pixel of the set can take one height level i among N different height levels, N≥2. The height levels can be ordered from the lowest height level (i=1) to the highest height level i=N).

According to the disclosure, for a pixel of the set having a first height level equal to n, 2≤n≤N, and an adjacent pixel of the set having a second height level equal to m, lower than the first height level, in at least one of horizontal, vertical, or diagonal scanning direction, from a point at which the optical axis intersects the image sensor to at least one rim of the image sensor, the second height level m is equal to n−1.

More generally, if we don't consider only downward transition (i.e. adjacent pixels where the first pixel has a first height level and the second pixel has a second height level, lower than the first height level, in the scanning direction), then for every pixel of the set having a first height level equal to n, 2≤n≤N, and adjacent pixel of the set having a second height level (higher, equal or lower than the first height level), in at least one of horizontal, vertical, or diagonal scanning direction, from a point at which the optical axis intersects the image sensor to at least one rim of the image sensor, the second height level is equal to m, with n−1≤m≤N. In this case, two adjacent pixels can thus have the same height, with identical or different colors.

A simplified example of an image sensor with pixels arranged according to at least one embodiment of the disclosure is illustrated in FIG. 2. More specifically, FIG. 2 presents, in a schematic way, a cross-section view of several pixels in an image sensor 21, according to one embodiment of the disclosure.

The pixel architecture is for example the one disclosed in previously cited European patent application EP17306274.6 for which the optical stack of conventional pixels is replaced by an element that can achieve both the focusing functionality and the color filtering functionality. Such element is made of a dielectric material, and the refractive index of this dielectric element is dependent of the color filtering functionality.

More precisely, according to one embodiment of the disclosure, each pixel comprises a first element (the photodiode unit) and a second element (that can both focus and filter incident light). For example, the second elements referenced 211 can focus incident light and substantially only transmits red light. The second elements referenced 212 can focus incident light and substantially only transmits green light. At last, the second elements referenced 213 can focus incident light and substantially only transmits blue light.

In another embodiment of the disclosure, a second element substantially only transmits either one of the following colors: cyan, magenta, yellow. In another embodiment, the image sensor according to the present disclosure also comprises white pixels. In another embodiment of the disclosure, it is proposed a second element that has filtering properties in other color channels used in image sensor devices.

According to the embodiment illustrated in FIG. 2, the image sensor 21 comprises pixels that can take one height level among three height levels (N=3, for example a high height level corresponding to n=3, a medium height level corresponding to n=2, and a low height level corresponding to n=1) and the height for each second element in a pixel is defined according to the colors it can filter. For example, the second elements referenced 211 only transmits the red color and has a low level height (also called red pixels). The second elements referenced 212 only transmits the green color and has a medium level height (also called green pixels). At last, the second elements referenced 213 only transmits the blue color and has a high level height (also called blue pixels).

The height of a pixel can thus be defined as the thickness h of the second element. In one variant, the height of a pixel can be defined as the thickness H of the first and second elements. However, as all the first elements have the same thickness according to this embodiment, the final height only depends on the thickness of the second element.

The optical axis 22 of the image sensor is defined by the main lens 23, and is the axis that intersects the center point of the main lens 23, and usually the center of the image sensor.

According to the embodiment illustrated in FIG. 2, if we consider a vertical scanning direction from the point O at which the optical axis 22 intersects the image sensor 21 to at least one rim of the image sensor, the pixels are arranged by decreasing height level. In other words, a blue pixel which has a high height level n=3 is arranged adjacent to a green pixel which has a medium height level n=2, which is arranged adjacent to a red pixel which has a low height level n=1.

As the pixels are arranged to minimize the height difference between two adjacent pixels in a scanning direction starting from the point O to a border of the image sensor, the arrangement of pixels is symmetrical with respect to the optical axis.

In addition, as the height difference between two adjacent pixels in a scanning direction starting from the point O to a border of the image sensor is minimized, the shadowing effect of the incident light, even at the most inclined incidence angle, is reduced.

On the contrary, according to the prior art such as disclosed in the previously cited European patent application EP17306274.6, different heights of the color filters make the amount of light received by each pixel, and consequently the performance of the image sensor asymmetric, depending on the direction of the incident light.

According to this embodiment of the disclosure, the pixels are thus arranged in the array based on at least the finished height of the pixel compared to its neighbors, and relative position of the pixels to the optical axis. In this way, it is possible to choose the arrangement with the least of negative steps (local high to low changes in the surface profile of the image sensor), scanning from a point at which the optical axis intersects the image sensor (i.e. center of the image sensor) to the side(s) of the image sensor.

FIG. 3 is another side view of the image sensor of FIG. 2, illustrating the different scanning directions, from the point O at which the optical axis 22 intersects the image sensor 21 to the side(s) of the image sensor, which can be horizontal scanning 31, vertical scanning 32, or diagonal scanning 33.

5.2 Disclosure of Different Embodiments

We describe below different embodiments according to which the height/thickness of the optical stack (formed, for example, by a Nj-lens and a color filter) is adjusted for pixels in each color channel.

It should be noted that the disclosure is not limited to this particular architecture of the pixels, but concerns all pixels that can have different height, for example when a depth sensing pixel is combined with an RGB pixel.

A) Bayer Filter

Usually, the color filter array in the image sensor is a periodic mosaic of small color filters dedicated to each pixel. Pattern size is the size of the smallest unit in the mosaic, e.g. 2×2 is the pattern size for the Bayer filter and the repetition of this pattern in horizontal and vertical directions creates the Bayer filter:

| G | R |
| B | G | where R stands for a pixel with a red color filter (also called red pixel), B stands for a pixel with a blue color filter (also called blue pixel) and G stands for a pixel with a green color filter (also called green pixel). Such smallest unit is also called a patch.

In this case, the pattern size is 2 in horizontal, vertical or diagonal scanning direction.

B) N=2

We consider a first example according to which the number of height level N is equal to 2 in one scanned direction.

i) Pattern Size Equal to 2

For example, if we consider the first line of the 2×2 pattern for the Bayer filter, the green pixel can have a medium level height M, and the red pixel can have a low level height L. We thus consider a height pattern of size 2 in the horizontal scanning direction, starting from the center of the image sensor to the side.

For a height pattern size equal to 2, alteration of the pixel positions in the base pattern (GR→RG) does not affect the array, as they both result in the same arrangement in the array:

GRGRGRGRGRGR . . .

or express in height:

MLMLMLMLMLML . . .

ii) Pattern Size Greater than 2

For a height pattern size greater than 2, at least one embodiment of the disclosure suggests an arrangement of the pixels which lead to a minimum amount of negative steps (i.e. downward transitions) in the profile of the image sensor in the scanning direction.

For example, the pixels are arranged to comply with a periodic height pattern of size 4, such as:

GRRG or RGGR

Both patterns result in the same arrangement in the array:

GRRGGRRGGRRGGRRG . . .

or express in height:

MLLMMLLMMLLMMLLM . . .

According to such arrangement, for every pixel of the set having a height level n=2 (medium height level M), the adjacent pixel of the set has a height level m=1 (lower height level–L) or m=2 (equal height level–M) in one scanning direction (horizontal direction), from a point at which the optical axis intersects the image sensor to at least one border of the image sensor.

C) N=3

We now consider a second example according to which the number of height level N is equal to 3 in one scanned direction.

For example, we consider that blue pixels can have a high height level H (n=3), that green pixels can have a medium height level M (n=2), and that red pixels can have a low height level L (n=1).

i) Pattern Size Equal to 3

For a height pattern size equal to 3, at least one embodiment of the disclosure suggests an arrangement of the pixels leading to a minimum amount of negative steps (i.e. downward transitions) in the profile of the image sensor in the scanning direction.

With three types of pixels with different heights in a scanned direction, and a height pattern size of 3, we get the following two arrangements:

LMH or LHM

The first pattern LMH also covers the arrangements MHL and HLM, which are cyclic permutation of the first pattern LMH.

The first pattern or its cyclic permutations results in the following arrangement in the array:

LMHLMHLMHLMH . . .

The second pattern LHM also covers the arrangements HML and MLH which are cyclic permutation of the second pattern LHM.

The second pattern or its cyclic permutations results in the following arrangement in the array:

LHMLHMLHMLHM . . .

According to either arrangement, for every pixel of the set having a height level n=3, the adjacent pixel of the set has a height level m=2 (lower height level) or m=3 (equal height level) in one scanning direction, from a point at which the optical axis intersects the image sensor to at least one border of the image sensor (if we consider one scanning line, scanning from right to left for the first arrangement, i.e. in reverse direction to the pixel arrangement, or from left to right for the second arrangement, i.e. in the same direction than the pixel arrangement). For every pixel of the set having a height level n=2, the adjacent pixel of the set has a second height level m=1 (lower height level) or m=2 (equal height level) or m=3 (higher height level) in the scanning direction, from the point at which the optical axis intersects the image sensor to at least one border of the image sensor (scanning from right to left for the first arrangement, or from left to right for the second arrangement).

FIG. 4 gives an example of a decision table illustrating how to arrange the colors within the array to minimize shadowing effects for each illumination mean direction and each configuration of high (blue), medium (green) and low (red) heights. The first solution corresponds to the one illustrated in FIG. 2.

In this case, the scanning direction is the same as the main mean illumination direction.

ii) Pattern Size Greater than 3

For a height pattern size greater than 3, at least one embodiment of the disclosure suggests an arrangement of the pixels also leading to a minimum amount of negative steps (i.e. downward transition) in the profile of the image sensor in the scanning direction.

For instance, with three types of pixels with different heights in a scanned direction, a height pattern size of 6, and assuming that the height pattern respects a proximity criterion according to which there is one instance of each color in the first half of the height pattern and one instance of each color in the second half of the height pattern, we get the following arrangements:

LMHHML or HMLHML or LMHLMH

The first pattern LMHHML also covers the arrangements MHHMLL, HHMLLM, and HMLLMH which are cyclic permutation of the first pattern LMHHML.

The first pattern or its cyclic permutations results in the following arrangement in the array:

LMHHMLLMHHMLLMHHML . . .

The second pattern HMLHML also covers the arrangements MLHMLH and LHMLHM which are cyclic permutation of the second pattern HMLHML.

The second pattern or its cyclic permutations results in the following arrangement in the array:

HMLHMLHMLHMLHMLHML . . .

The third pattern LMHLMH also covers the arrangements MHLMHL and HLMHLM which are cyclic permutation of the third pattern LMHLMH.

The third pattern or its cyclic permutations results in the following arrangement in the array:

LMHLMHLMHLMHLMHLMH . . .

According to either arrangement, for every pixel of the set having a height level n=3, the adjacent pixel of the set has a height level m=2 (lower height level) or m=3 (equal height level) in one scanning direction, from a point at which the optical axis intersects the image sensor to at least one border of the image sensor (if we consider one scanning line, scanning from right to left or left to right for the first arrangement, left to right for the second arrangement, right to left for the third arrangement). For every pixel of the set having a height level n=2, the adjacent pixel of the set has a second height level m=1 (lower height level) or m=2 (equal height level) or m=3 (higher height level) in the scanning direction, from the point at which the optical axis intersects the image sensor to at least one border of the image sensor (scanning from right to left or left to right for the first arrangement, left to right for the second arrangement, right to left for the third arrangement).

FIG. 5 gives an example of a decision table illustrating how to arrange the colors within the array to minimize shadowing effects for each illumination mean direction and each configuration of high (blue), medium (green) and low (red) heights. In this case, the scanning direction is the same as the main mean illumination direction.

In the arrangement illustrated in FIG. 5, the arrangement in the first half of the height pattern doesn't need to be identical to the arrangement in the second half of the height pattern. For example, the RGB order in the first three RGB pixels of the height pattern can be different from the RGB order in the second three RGB pixels of the height pattern.

The proposed arrangements illustrated in FIG. 5 can be used to reduce the shadowing effect compared to state-of-the-art arrangements for both or a single illumination direction. Where there are several possible arrangements for minimizing the shadowing effect, then other criterion, for example performance measures, can be used to select an optimal arrangement. For instance, if an arrangement optimized for each illumination direction proposed in FIG. 5 performs better in terms of crosstalk compared to an arrangement for both illumination directions, then the arrangement optimized for each illumination direction can be prioritized over the arrangement for both illumination directions.

D) N≥3

The proposed solution is also extendable to image sensors with four or more types of pixels with different heights in at least one scanned direction. The same design rule applies to all other cases: minimizing the shadowing effect by choosing the arrangement with the least amount of sudden high to low transition in the height of the neighboring pixel in the surface profile of the image sensor, scanning from the center of the image sensor to the sides.

In other words, whatever is the number of height levels, the height difference between two adjacent pixels in at least one of horizontal, vertical, or diagonal scanning direction, from a point at which the optical axis intersects the image sensor to at least one border of the image sensor, is minimized.

E) Other Examples

In the previous sections, we described possible arrangements for a line of pixels in the array, considering a horizontal scanning direction.

However, it should be noted that the possible pixels arrangements described above, for example illustrated in FIGS. 4 and 5, can be applied to a column and/or diagonal of pixels in the array, considering a vertical and/or diagonal scanning direction, such as illustrated in FIG. 3.

Similarly, for each arrangement, there will be two mean illumination directions, same or in reverse to the pixel arrangement.

F) Example of a New Mosaic Pattern

According to at least one embodiment of the disclosure, the arrangement of pixels in the image sensor also respects at least one design criterion, such as a proximity criterion defining the distribution of the color filters in a color pattern or a distribution ratio defining the ratio of the different height levels in the height pattern. Indeed, the design rule is preferably applied within the general framework for designing color filters, for example there should be no big areas with same color pixels which will cause missing color information in a demosaicking process.

The demosaicking process is an algorithm that permits to recover a full color image. In fact, due to the color filters, each pixel registers only one color information: red, green or blue for example (or red, green, blue or white—RGBW, or cyan, magenta and yellow—CMY, etc). The demosaicking process aims at estimating the missing components. Generally, the missing information is estimated from the very near neighborhood of the pixels.

When the architecture of each color pixel channel is optimized for a color channel and, as a result, the height of the pixels for each color channel is different from other channels, the design rule for minimizing the shadowing effect according to at least one embodiment of the disclosure might require the use of an unconventional mosaic pattern. Noise performance, maximizing the light intake or other design constraints might also require unconventional mosaic patterns.

In these cases, new mosaicking patterns should be proposed that comply with all design constraints and can be properly demosaicked.

However, none of the existing patterns for the color filter array deals with the case that the finished height of the image sensor pixels is different for each color channel. For this case, we need a mosaicking pattern which aims at minimizing the negative effect of this irregularity on the neighboring pixels, as the higher pixels can partially block the incident light to their lower neighboring pixels.

In addition, arranging the color pixels in a different manner than in the Bayer configuration can lead to problems in the so-called demosaicking process.

The disclosure also pertains, according to at least one embodiment, to a new mosaic pattern for the color filter array in image sensors with pixel height adjusted for each color channel and the corresponding demosaicking algorithm. The arrangement of pixels obtained through the repetition of such pattern, and the corresponding demosaicking algorithm, improves the performance for an image sensor with different pixel heights for each color channel. In particular, such arrangement respects the proximity criterion and aims at reducing the shadowing effect in the image sensor.

For example, such pattern is designed so that the arrangement of pixels obtained by repetition of the pattern in horizontal and vertical directions respects some design criteria:
- the mosaic pattern shall have 50% of green pixels, 25% of red pixel and 25% of blue pixels (distribution ratio criterion);
- the interleave of different colors in the array shall ensure a good proximity of the missing color (proximity criterion), and
- the repetition of the pattern should minimize the shadowing, i.e. the difference in height between two adjacent pixels in a scanning direction should be the smallest as possible (shadowing minimization criterion).

According to at least one embodiment, such mosaic pattern can be designed using the following design rule: considering N different height levels, N≥2, ordered from the lowest height level, denoted as level 1, to the highest height level, denoted as level N, for every pixel n in at least one horizontal, vertical, or diagonal scanning from center to the border of the image sensor, if the height level of a pixel is n, 2≤n≤N, then the height level of the neighboring pixel m in the scanning direction should be within the range n−1≤m≤N.

For example, the proposed pattern comprises a patch of 8×8 pixels arranged as follows:

| | | |
|---|---|---|
| RGBGGBGR | | BGRGGRGB |
| GBGRRGBG | | GRGBBGRG |
| BGRGGRGB | | RGBGGBGR |
| GRGBBGRG | or | GBGRRGBG |
| GRGBBGRG | | GBGRRGBG |
| BGRGGRGB | | RGBGGBGR |
| GBGRRGBG | | GRGBBGRG |
| RGBGGBGR | | BGRGGRGB | where, considering three height levels, R stands for a pixel with a red color filter having a low height, B stands for a pixel with a blue color filter having a high height and G stands for a pixel with a green color filter having a medium height.

In particular, as such pattern, and consequently the image sensor obtained by the repetition of the pattern in horizontal and vertical directions, respects the proximity criterion, an interpolation using the nearest neighboring pixels is possible to recover a missing color. For example, for a red pixel at row and column (i,j) of the color filter array, which misses green and blue information, such green and blue information can be reconstructed by interpolating pixels at position i±1 and j±1.

The main steps of a demosaicking method for recovering a full color image according to at least one embodiment of the disclosure are illustrated in FIG. 6.

Such method comprises, for at least one current pixel 61 with a first color (C1) of the image:
estimating the missing colors (C2, C3) of the current pixel, by:
for each missing color:
for each pixel adjacent to the current pixel:
if the color of the adjacent pixel differs from the first color of the current pixel (621, 622), then determine a luminance value of the adjacent pixel (631, 632), determine a mean luminance value (641, 642) from the previously determined luminance values.

Such method can be implemented for all the pixels of the image.

We present below an example of demosaicking algorithm for a pixel at position (i,j) in the image to be recovered:

```
Do this for color C, different from color at position (i, j) and different from color D:
    SumLumaC = 0
    CountC = 0
    For ix = i − 1 to ix = i + 1
        For iy = j − 1 to iy = j + 1
            if color at position (ix, iy) is different from color at position (i, j)
                If ix ≠ i and iy ≠ j
                    SumLumaC = SumLumaC + LumaAt (ix , iy)
                    CountC + +
                End
            End
        End
    End
Do this for color D, different from color at position (i, j) and different from color C:
    SumLumaD = 0
    CountD = 0
    For ix = i − 1 to ix = i + 1
        For iy = j − 1 to iy = j + 1
            if color at position (ix, iy) is different from color at position (i, j)
                If ix ≠ i and iy ≠ j
                    SumLumaD = SumLumaD + LumaAt(ix, iy)
                    CountD + +
                End
            End
        End
    End
    LumaC(i, j) = SumLumaC/CountC
    LumaD(i, j) = SumLumaD/CountD
```

Such algorithm can be repeated for each position (i,j) within the image.

The proposed mosaic pattern, seeking to minimize the shadowing effect, and a classical Bayer pattern have been applied to a same image in order to compare the results. For both patterns, it was possible to recover a full color image Both methods have artefacts around edges only, which can be corrected by implementing an edge following demosaicking method.

One advantage of the proposed mosaic pattern and associated demosaicking algorithm according to at least one embodiment of the disclosure is that it provides a practical means for implementing image sensors with nonhomogeneous height of the pixels, letting us benefit from the improved filtering performance of the tuned filters for each color channel, while minimizing the risk for the shadowing of the neighboring pixels on each other.

The proposed pattern can of course be generalized for other color mosaics e.g. CMY, RGBW, etc.

For other color mosaics like CMY, RGBW or others, we should know the height of each color channel and possibly other design criteria. For example, a CMY color mosaic with a distribution ratio of 25% (for C), 25% (for M) and 50% (for Y), and height levels of High (for C), Low (for M) and Medium (for Y) can be treated similar to the proposed RGB pattern.

5.3 Method for Designing an Arrangement of Pixels

FIG. 7 illustrates the main step of a method for designing an arrangement of pixels in an image sensor, according to at least one embodiment.

Such method comprises:
- obtaining 71 a set of pixels with different height levels, wherein each pixel of the set can take a height level among N different height levels, N≥2. For example, such set is obtained using the technique disclosed in the previously cited European patent application EP17306274.6, which can deliver pixel with different heights;
- arranging 72 the pixels of the set in an array of the image sensor, according to their height and relative position to an optical axis of the image sensor, wherein, for a pixel of the set having a first height level equal to n, 2≤n≤N, and an adjacent pixel of the set having a second height level, lower than the first height level, in at least one of horizontal, vertical, or diagonal scanning direction, from a point at which the optical axis intersects the image sensor to at least one rim of the image sensor, the second height level is equal to m=n−1.

More generally, if we don't consider only downward transition (i.e. adjacent pixels where the first pixel has a first height level and the second pixel has a second height level, lower than the first height level, in the scanning direction), then for every pixel of the set having a first height level equal to n, 2≤n≤N, and adjacent pixel of the set having a second height level (higher, equal or lower than the first height level), in at least one of horizontal, vertical, or diagonal scanning direction, from a point at which the optical axis intersects the image sensor to at least one rim of the image sensor, the second height level is equal m, with n−1≤m≤N.

Such design method can be implanted in a design device comprising a non-volatile memory (e.g. a read-only memory (ROM) or a hard disk), a volatile memory (e.g. a random access memory or RAM) and a processor. The non-volatile memory is a non-transitory computer-readable carrier medium. It stores executable program code instructions, which are executed by the processor in order to enable implementation of the method described above in its various embodiments.

Upon initialization, the aforementioned program code instructions are transferred from the non-volatile memory to the volatile memory so as to be executed by the processor. The volatile memory likewise includes registers for storing the variables and parameters required for this execution.

The steps of the design method according to at least one embodiment of the disclosure may be implemented equally well:

by the execution of a set of program code instructions executed by a reprogrammable computing machine such as a PC type apparatus, a DSP (digital signal processor) or a microcontroller. This program code instructions can be stored in a non-transitory computer-readable carrier medium that is detachable (for example a floppy disk, a CD-ROM or a DVD-ROM) or non-detachable; or by a dedicated machine or component, such as an FPGA (Field Programmable Gate Array), an ASIC (Application-Specific Integrated Circuit) or any dedicated hardware component.

In other words, the disclosure is not limited to a purely software-based implementation, in the form of computer program instructions, but that it may also be implemented in hardware form or any form combining a hardware portion and a software portion.

According to at least on embodiment of the disclosure, such design device can control the fabrication process of the image sensor, and more specifically the lithography masks that must be adapted to the new arrangement of pixels. Implementation of the proposed arrangement of the height of the pixels indeed require adaptation of the masks to the new pixels arrangement, for proper deposition and patterning of, for example, each color filter channel material. No new fabrication step is necessary for the arrangement of pixels according to at least one embodiment of the disclosure.

What is claimed:

1. An image sensor comprising an array of pixels,
   wherein a set of pixels of the array comprises pixels with different height levels arranged according to their height level and relative position to an optical axis of the image sensor,
   wherein each pixel of the set can take one height level i among N different height levels, N≥3, where i=1 is the smallest height level and i=N is the highest height level, and wherein, for a pixel of the set having a first height level equal to n, 2≤n≤N, and an adjacent pixel of the set having a second height level equal to m, lower than the first height level, in at least one of horizontal, vertical, or diagonal scanning direction, from a point at which the optical axis intersects the image sensor to at least one rim of the image sensor, the second height level m is equal to n−1,
   wherein the array comprises rows and columns of pixels, and wherein pixels having each of the different height levels i are present in each row and each column of the array;
   wherein the pixels of the set comprise color filters, and wherein, for each pixel, the height level of the pixel depends on the color selectivity of the color filter;
   wherein the height pattern comprises 50% of pixels with a green color filter, 25% of pixels with a blue color filter, and 25% of pixels with a red color filter, and wherein the pixels with different color filters are interleaved in the height pattern; and
   wherein the height pattern comprises 8×8 pixels arranged as follows:

| RGBGGBGR | | BGRGGRGB |
| GBGRRGBG | | GRGBBGRG |
| BGRGGRGB | | RGBGGBGR |
| GRGBBGRG | or | GBGRRGBG |
| GRGBBGRG | | GBGRRGBG |
| BGRGGRGB | | RGBGGBGR |
| GBGRRGBG | | GRGBBGRG |
| RGBGGBGR | | BGRGGRGB | where R stands for a pixel with a red color filter, B stands for a pixel with a blue color filter and G stands for a pixel with a green color filter.

2. An image sensor comprising an array of pixels arranged in a repeating 8×8 pattern as follows, where R represents a pixel with a red color filter, G represents a pixel with a green color filter, and B represents a pixel with a blue color filter:

| RGBGGBGR | | BGRGGRGB |
| GBGRRGBG | | GRGBBGRG |
| BGRGGRGB | | RGBGGBGR |
| GRGBBGRG | or | GBGRRGBG |
| GRGBBGRG | | GBGRRGBG |
| BGRGGRGB | | RGBGGBGR |
| GBGRRGBG | | GRGBBGRG |
| RGBGGBGR | | BGRGGRGB |

3. The image sensor of claim 2, wherein each pixel with a red color filter has a first height, each pixel with a green color filter has a second height different from the first height, and each pixel with a blue color filter has a third height different from the first height and the second height.

4. The image sensor of claim 2, wherein each pixel with a red color filter has a first height, each pixel with a green color filter has a second height greater than the first height, and each pixel with a blue color filter has a third height greater than the second height.

* * * * *